United States Patent
Feng et al.

(10) Patent No.: US 9,588,360 B2
(45) Date of Patent: Mar. 7, 2017

(54) TEMPERATURE CONTROL OF COMPONENTS ON AN OPTICAL DEVICE

(71) Applicant: Kotura, Inc., Monterey Park, CA (US)

(72) Inventors: Dazeng Feng, El Monte, CA (US); Wei Qian, Torrance, CA (US); Zhi Li, Alhambra, CA (US); Jacob Levy, Sierra Madre, CA (US)

(73) Assignee: Mellanox Technologies Silicon Photonics Inc., Monterey Park, CA (US)

( * ) Notice: Subject to any disclaimer, the term of this patent is extended or adjusted under 35 U.S.C. 154(b) by 368 days.

(21) Appl. No.: 14/231,383

(22) Filed: Mar. 31, 2014

(65) Prior Publication Data
US 2016/0170239 A1    Jun. 16, 2016

(51) Int. Cl.
| G02F 1/035 | (2006.01) |
| G02F 1/025 | (2006.01) |
| G02F 1/015 | (2006.01) |
| H01S 5/024 | (2006.01) |
| H01S 5/12  | (2006.01) |
| G02B 6/12  | (2006.01) |

(52) U.S. Cl.
CPC .............. *G02F 1/025* (2013.01); *G02F 1/015* (2013.01); *H01S 5/02453* (2013.01); *H01S 5/12* (2013.01); *G02B 2006/121* (2013.01); *G02B 2006/12142* (2013.01); *G02F 2001/0155* (2013.01); *G02F 2001/0157* (2013.01); *G02F 2203/60* (2013.01)

(58) Field of Classification Search
CPC ............. G02F 2001/0155; G02F 1/025; G02F 2001/0157; G02F 1/015; G02F 2203/60; H01S 5/0243; H01S 5/12; G02B 2006/12142; G02B 2006/121
See application file for complete search history.

(56) References Cited

U.S. PATENT DOCUMENTS

| 6,665,457 B2 * | 12/2003 | Lundqvist ............. H01S 5/0265 385/14 |
| 8,014,636 B2 * | 9/2011 | Shubin .................... B82Y 20/00 257/21 |
| 8,638,485 B2 * | 1/2014 | Feng ...................... G02F 1/0147 359/238 |
| 2003/0025976 A1 | 2/2003 | Wipiejewski |
| 2003/0048976 A1 | 3/2003 | Lundqvist |
| 2004/0190848 A1 * | 9/2004 | Ide .......................... G02B 6/122 385/129 |
| 2010/0207223 A1 * | 8/2010 | Feng ................... G02B 6/12004 257/432 |
| 2011/0058765 A1 * | 3/2011 | Xu .......................... G02F 1/025 385/2 |
| 2011/0068425 A1 * | 3/2011 | Liao .................... G02B 6/12004 257/432 |

(Continued)

*Primary Examiner* — Rhonda Peace
(74) *Attorney, Agent, or Firm* — Gavrilovich, Dodd & Lindsey, LLP (57) ABSTRACT

The optical device includes a waveguide positioned on a base and a modulator positioned on the base. The modulator includes an electro-absorption medium. The waveguide is configured to guide a light signal through the modulator such that the light signal is guided through the electro-absorption medium. A heater is positioned on the electro-absorption medium such that the electro-absorption medium is between the base and the heater.

24 Claims, 6 Drawing Sheets

(56) References Cited

U.S. PATENT DOCUMENTS

| | | | |
|---|---|---|---|
| 2011/0142390 A1* | 6/2011 | Feng | G02F 1/025 385/2 |
| 2012/0243828 A1* | 9/2012 | Suzuki | G02B 6/12007 385/32 |
| 2013/0020668 A1* | 1/2013 | Qian | G02B 6/12004 257/432 |
| 2013/0229701 A1 | 9/2013 | Feng et al. | |
| 2013/0294472 A1* | 11/2013 | Feng | H01S 5/0424 372/50.22 |
| 2014/0193113 A1* | 7/2014 | Akiyama | G02F 1/2257 385/2 |
| 2016/0170239 A1* | 6/2016 | Feng | G02F 1/015 385/2 |

* cited by examiner

TEMPERATURE CONTROL OF COMPONENTS ON AN OPTICAL DEVICE

FIELD

The present invention relates to optical devices and particularly, to optical devices that include multiple optical components.

BACKGROUND

Many communications applications require the linking of multiple different optical components such as light source and modulators. For instance, there is a demand for modulators that modulate a light signal from a light source such as a laser. These components are often designed so they work well together at a particular temperature. However, different optical components such as lasers and modulators generally respond to temperature changes differently. As a result, two components may operate well together at one temperature but fail to operate together at other temperatures. As a result, there is a need for an optical device that integrates multiple optical components and can be used in a variety of temperature conditions.

SUMMARY

An optical device includes a waveguide positioned on a base and a modulator positioned on the base. The modulator includes an electro-absorption medium. The waveguide is configured to guide a light signal through the modulator such that the light signal is guided through the electro-absorption medium. A heater is positioned on the electro-absorption medium such that the electro-absorption medium is between the heater and the base.

BRIEF DESCRIPTION OF THE FIGURES

FIG. 1A and FIG. 1B illustrates an optical device having a waveguide that guides a light signal between a light source and a modulator.

FIG. 2A through FIG. 2E illustrate construction of a modulator that is suitable for use as the modulator of FIG. 1A.

FIG. 4A through FIG. 4C illustrate a localized heater in conjunction with a modulator.

FIG. 6A and FIG. 6B illustrate the device of FIG. 4A through FIG. 4C in combination with the modulator of FIG. 2E.

DESCRIPTION

An optical device has a modulator that includes an electro-absorption medium. The device also includes a waveguide configured to guide a light signal through the electro-absorption medium included in the modulator. The device also includes a localized heater that is positioned on at least a portion of the electro-absorption medium that is included in the modulation. For instance, the modulator can include a ridge of the electro-absorption medium and the heater can be positioned on top of the ridge of electro-absorption medium. Electronics can operate the heater such that the modulator provides efficient modulation despite the temperature of the source of the light signal being anywhere in the full operational temperature range of the device. Placing the heater on the ridge rather than spaced apart from the ridge provides a more direct heat transfer to the modulator and accordingly reduces the energy requirements of the heater. For instance, simulation results have shown that maximum power usage of only 54-108 mW per heater can be achieved. It may be possible to achieve this same result by controlling the temperature of the entire device through the use of temperature control systems such as thermoelectric coolers (TEC). However, these temperature control systems add cost and complexity to the device at the point of fabrication. Further, these temperature control system have undesirably large power requirements and are accordingly associated with ongoing operation costs. As a result, the localized heater can reduce the costs and power requirements associated with the device.

Figure 1A:
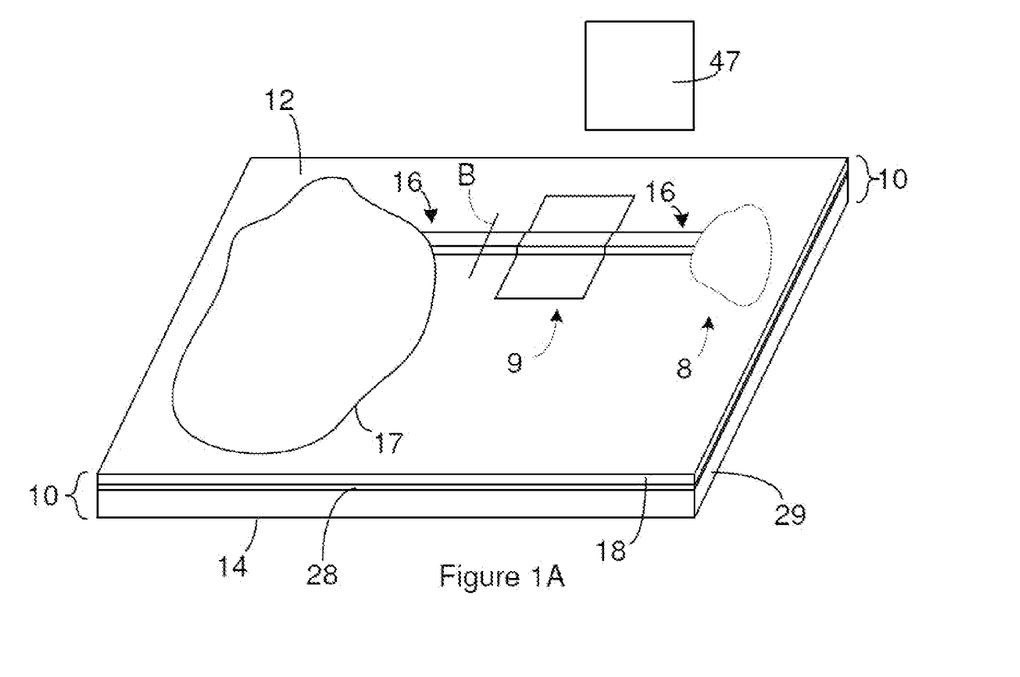
FIG. 1A is a perspective view of the device.
Figure 1B:
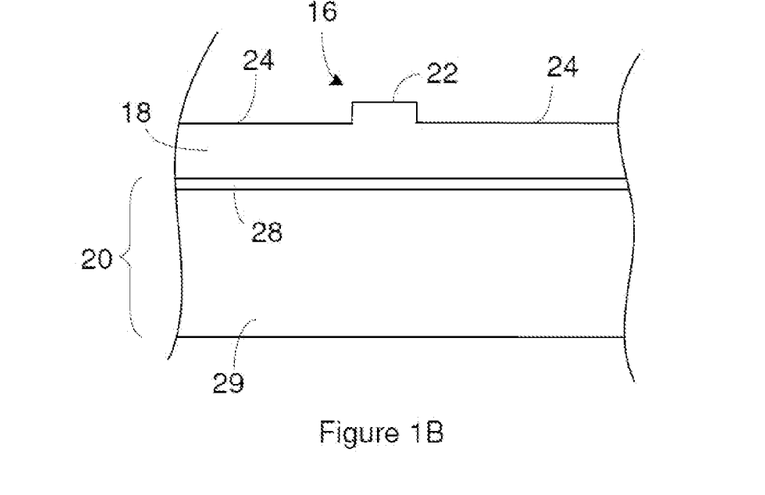
FIG. 1B is a cross section of the device taken along the line labeled B in FIG. 1A.

FIG. 1A and FIG. 1B illustrate an optical device having a waveguide that guides a light signal between a light source 8 and a modulator 9. FIG. 1A is a perspective view of the device. FIG. 1B is a cross section of the device taken along the line labeled B in FIG. 1A. FIG. 1A and FIG. 1B do not show details of either the light source 8 or the modulator but illustrates the relationship between these components and the waveguide.

The device is within the class of optical devices known as planar optical devices. These devices typically include one or more waveguides immobilized relative to a substrate or a base. The direction of propagation of light signals along the waveguides is generally parallel to a plane of the device. Examples of the plane of the device include the top side of the base, the bottom side of the base, the top side of the substrate, and/or the bottom side of the substrate.

The illustrated device includes lateral sides 10 (or edges) extending from a top side 12 to a bottom side 14. The propagation direction of light signals along the length of the waveguides on a planar optical device generally extends through the lateral sides 10 of the device. The top side 12 and the bottom side 14 of the device are non-lateral sides.

The device includes one or more waveguides 16 that carry light signals to and/or from optical components 17. Examples of optical components 17 that can be included on the device include, but are not limited to, one or more components selected from a group consisting of facets through which light signals can enter and/or exit a waveguide, entry/exit ports through which light signals can enter and/or exit a waveguide from above or below the device, multiplexers for combining multiple light signals onto a single waveguide, demultiplexers for separating multiple light signals such that different light signals are received on different waveguides, optical couplers, optical switches, lasers that act as a source of a light signal, amplifiers for amplifying the intensity of a light signal, attenuators for attenuating the intensity of a light signal, modulators for modulating a signal onto a light signal, modulators that convert a light signal to an electrical signal, and vias that provide an optical pathway for a light signal traveling through the device from the bottom side 14 of the device to the top side 12 of the device. Additionally, the device can optionally, include electrical components. For instance, the device can include electrical connections for applying a potential or current to a waveguide and/or for controlling other components on the optical device.

A portion of the waveguide includes a first structure where a portion of the waveguide 16 is defined in a light-transmitting medium 18 positioned on a base 20. For instance, a portion of the waveguide 16 is partially defined by a ridge 22 extending upward from a slab region of the light-transmitting medium as shown in FIG. 1B. In some instances, the top of the slab region is defined by the bottom of trenches 24 extending partially into the light-transmitting medium 18 or through the light-transmitting medium 18. Suitable light-transmitting media include, but are not limited to, silicon, polymers, silica, SiN, GaAs, InP and LiNbO$_3$.

The portion of the base 20 adjacent to the light-transmitting medium 18 is configured to reflect light signals from the waveguide 16 back into the waveguide 16 in order to constrain light signals in the waveguide 16. For instance, the portion of the base 20 adjacent to the light-transmitting medium 18 can be a light insulator 28 with a lower index of refraction than the light-transmitting medium 18. The drop in the index of refraction can cause reflection of a light signal from the light-transmitting medium 18 back into the light-transmitting medium 18. The base 20 can include the light insulator 28 positioned on a substrate 29. As will become evident below, the substrate 29 can be configured to transmit light signals. For instance, the substrate 29 can be constructed of a light-transmitting medium 18 that is different from the light-transmitting medium 18 or the same as the light-transmitting medium 18. In one example, the device is constructed on a silicon-on-insulator wafer. A silicon-on-insulator wafer includes a silicon layer that serves as the light-transmitting medium 18. The silicon-on-insulator wafer also includes a layer of silica positioned on a silicon substrate. The layer of silica can serving as the light insulator 28 and the silicon substrate can serve as the substrate 29.

Although the light source 8 is shown positioned centrally on the device, the light source 8 can be positioned at the edge of the device. The light source 8 can be any type of light source including light sources that convert electrical energy into light. Examples of suitable light sources include, but are not limited to, a semiconductor laser, and a semiconductor amplifier such as a reflection semiconducting optical amplifier (RSOA). Examples of suitable lasers include, but are not limited to, Fabry-Perot lasers, Distributed Bragg Reflector lasers (DBR lasers), Distributed FeedBack lasers (DFB lasers), external cavity lasers (ECLs). A variety of suitable lasers and laser constructions are disclosed in light source applications including U.S. patent application Ser. No. 13/385,774, filed on Mar. 5, 2012, and entitled "Integration of Components on Optical Device;" U.S. patent application Ser. No. 14/048,685, filed on Oct. 8, 2013, and entitled "Use of Common Active Materials in Optical Components;" U.S. Provisional Patent Application Ser. No. 61/825,501, filed on May 20, 2013, and entitled "Reducing Power Requirements for Optical Links;" U.S. patent application Ser. No. 13/694,047, filed on Oct. 22, 2012, and entitled "Wafer Level Testing of Optical Components;" U.S. patent application Ser. No. 13/506,629, filed on May 2, 2012, and entitled "Integration of Laser into Optical Platform;" U.S. patent application Ser. No. 13/573,892, filed on Oct. 12, 2012, and entitled "Reduction of Mode Hopping in a Laser Cavity;" U.S. patent application Ser. No. 13/317,340, filed on Oct. 14, 2011, and entitled "Gain Medium Providing Laser and Amplifier Functionality to Optical Device;" U.S. patent application Ser. No. 13/385,275, filed on Feb. 9, 2012, and entitled "Laser Combining Light Signals from Multiple Laser Cavities;" each of which is incorporated herein in its entirety. The light source 8 can be constructed as disclosed in any one or more of the light source applications and/or can be interfaced with the device as disclosed in any one or more of the light source applications. Other suitable light sources include interdevice waveguides that carry a light signal to the device from another device such as an optical fiber. A variety of interfaces between an optical fiber and a device constructed according to FIG. 1A and FIG. 1B are disclosed in fiber interface patents applications including U.S. patent application Ser. No. 12/228,007, filed on Nov. 14, 2008, and entitled "Optical System Having Optical Fiber Mounted to Optical Device," now abandoned; and U.S. patent application Ser. No. 12/148,784, filed on Apr. 21, 2008, entitled "Transfer of Light Signals Between Optical Fiber and System Using Optical Devices with Optical Vias," and issued as U.S. Pat. No. 8,090,231; each of which is incorporated herein in its entirety. The light source 8 can an optical fiber interfaced with a device as disclosed in any one or more of the fiber interface patents applications. In some instances, the device does not include a light source. For instance, the waveguide can terminate at a facet located at or near the perimeter of the device and a light signal traveling through air can then be injected into the waveguide through the facet. Accordingly, the light source is optional.

Figure 2A:
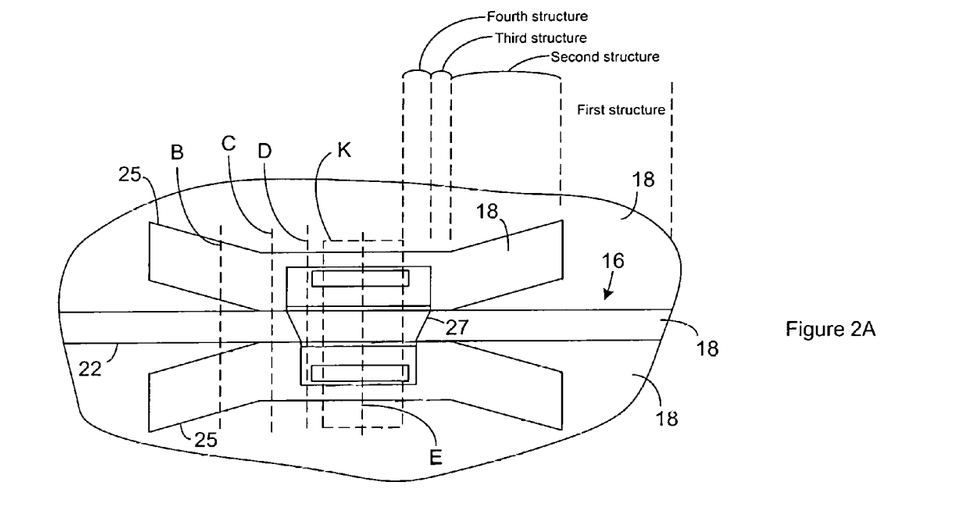
FIG. 2A is a topview of the portion of the optical device shown in FIG. 1A that includes an optical modulator.
Figure 2B:
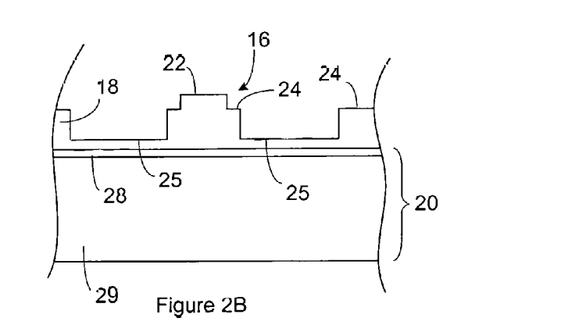
FIG. 2B is a cross-section of the optical device shown in FIG. 2A taken along the line labeled B.
Figure 2C:
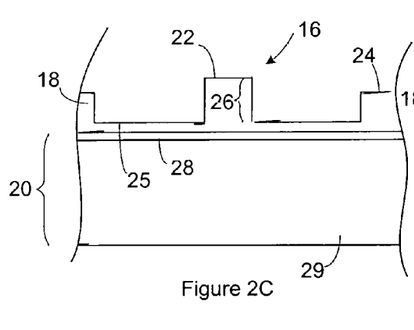
FIG. 2C is a cross-section of the optical device shown in FIG. 2A taken along the line labeled C.
Figure 2D:
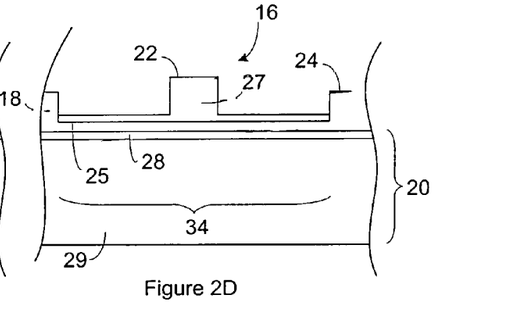
FIG. 2D is a cross-section of the optical device shown in FIG. 2A taken along the line labeled D.
Figure 2E:
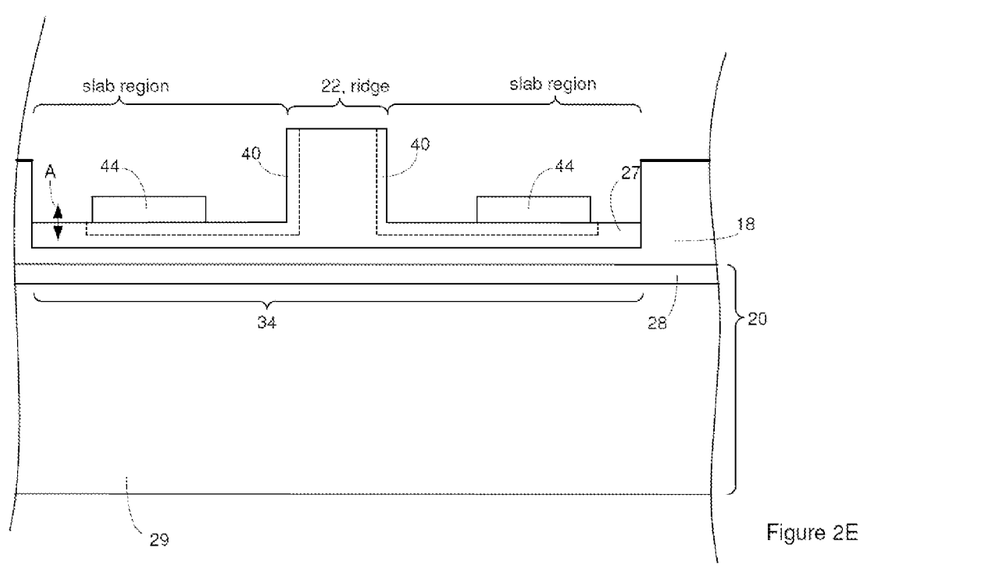
FIG. 2F is a cross-section of the optical device shown in FIG. 2A taken along the line labeled E.

FIG. 2A through FIG. 2E illustrate construction of a modulator that is suitable for use as the modulator of FIG. 1A. FIG. 2A is a topview of the portion of the optical device shown in FIG. 1A that includes an optical modulator. FIG. 2B is a cross-section of the optical device shown in FIG. 2A taken along the line labeled B. FIG. 2C is a cross-section of the optical device shown in FIG. 2A taken along the line labeled C. FIG. 2D is a cross-section of the optical device shown in FIG. 2A taken along the line labeled D. FIG. 2E is a cross-section of the optical device shown in FIG. 2A taken along the line labeled E.

Recesses 25 (FIG. 2A) extend into the slab regions such that the ridge 22 is positioned between recesses 25. The recesses 25 can extend part way into the light-transmitting medium 18. As is evident from FIG. 2B, the recesses 25 can be spaced apart from the ridge 22. As a result, a portion of the waveguide 16 includes a second structure where an upper portion of the waveguide 16 is partially defined by the ridge 22 extending upward from the slab region and a lower portion of the waveguide is partially defined by recesses 25 extending into the slab regions and spaced apart from the ridge.

As shown in FIG. 2C, the recesses 25 can approach the ridge 22 such that the sides of the ridge 22 and the sides of the recesses 25 combine into a single surface 26. As a result, a portion of a waveguide includes a third structure where the waveguide is partially defined by the surface 26.

As is evident in FIG. 2A, a portion of the waveguide 16 includes an electro-absorption medium 27. The electro-absorption medium 27 is configured to receive the light signals from a portion of the waveguide having the third structure and to guide the received light signals to another portion of the waveguide having the third structure.

In FIG. 2D, a ridge 22 of electro-absorption medium 27 extends upward from a slab region of the electro-absorption medium 27. Accordingly, a portion of a waveguide includes a fourth structure configured to guide the received light signal through the electro-absorption medium 27. This portion of the waveguide is partially defined by the top and lateral sides of the electro-absorption medium 27. The slab regions of the electro-absorption medium 27 and the ridge 22 of the electro-absorption medium 27 are both positioned on a seed portion 34 of the light-transmitting medium 18. As a result, the seed portion 34 of the light-transmitting medium 18 is between the electro-absorption medium 27 and the base 20. In some instances, when the light signal travels from the light-transmitting medium into the electro-absorption medium 27, a portion of the light signal enters the seed portion 34 of the light-transmitting medium 18 and another portion of the light signal enters the electro-absorption medium 27. As described above, the electro-absorption medium 27 can be grown on the seed portion of the light-transmitting medium 18. The seed layer is optional. For instance, the electro-absorption medium 27 can be grown or otherwise formed directly on the seed portion of the light-transmitting medium 18

As is evident in FIG. 2A, there is an interface between each facet of the electro-absorption medium 27 and a facet of the light-transmitting medium 18. The interface can have an angle that is non-perpendicular relative to the direction of propagation of light signals through the waveguide 16 at the interface. In some instances, the interface is substantially perpendicular relative to the base 20 while being non-perpendicular relative to the direction of propagation. The non-perpendicularity of the interface reduces the effects of back reflection. Suitable angles for the interface relative to the direction of propagation include but are not limited to, angles between 80° and 89°, and angles between 80° and 85°.

The optical device includes a modulator. The location of the modulator on the optical device is illustrated by the line labeled K in FIG. 2A. In order to simplify FIG. 2A, the details of the modulator construction are not shown in FIG. 2A. However, the modulator construction is evident from other illustrations such as FIG. 2E. The modulator of FIG. 2E is constructed on the portion of the waveguide having a fourth structure constructed according to FIG. 2D. The perimeter of portions of doped regions shown in FIG. 2E are illustrated with dashed lines to prevent them from being confused with interfaces between different materials. The interfaces between different materials are illustrated with solid lines. The modulator is configured to apply an electric field to the electro-absorption medium 27 in order to phase and/or intensity modulate the light signals received by the modulator.

A ridge 22 of the electro-absorption medium 27 extends upward from a slab region of the electro-absorption medium 27. Doped regions 40 are both in the slab regions of the electro-absorption medium 27 and also in the ridge of the electro-absorption medium 27. For instance, doped regions 40 of the electro-absorption medium 27 are positioned on the lateral sides of the ridge 22 of the electro-absorption medium 27. In some instances, each of the doped regions 40 extends up to the top side of the electro-absorption medium 27 as shown in FIG. 2E. Additionally, the doped regions 40 extend away from the ridge 22 into the slab region of the electro-absorption medium 27. The transition of a doped region 40 from the ridge 22 of the electro-absorption medium 27 into the slab region of the electro-absorption medium 27 can be continuous and unbroken as shown in FIG. 2E.

Each of the doped regions 40 can be an N-type doped region or a P-type doped region. For instance, each of the N-type doped regions can include an N-type dopant and each of the P-type doped regions can include a P-type dopant. In some instances, the electro-absorption medium 27 includes a doped region 40 that is an N-type doped region and a doped region 40 that is a P-type doped region. The separation between the doped regions 40 in the electro-absorption medium 27 results in the formation of PIN (p-type region-insulator-n-type region) junction in the modulator.

In the electro-absorption medium 27, suitable dopants for N-type regions include, but are not limited to, phosphorus and/or arsenic. Suitable dopants for P-type regions include, but are not limited to, boron. The doped regions 40 are doped so as to be electrically conducting. A suitable concentration for the P-type dopant in a P-type doped region includes, but is not limited to, concentrations greater than $1 \times 10^{15}$ cm$^{-3}$, $1 \times 10^{17}$ cm$^{-3}$, or $1 \times 10^{19}$ cm$^{-3}$, and/or less than $1 \times 10^{17}$ cm$^{-3}$, $1 \times 10^{19}$ cm$^{-3}$, or $1 \times 10^{21}$ cm$^{-3}$. A suitable concentration for the N-type dopant in an N-type doped region includes, but is not limited to, concentrations greater than $1 \times 10^{15}$ cm', $1 \times 10^{17}$ cm', or $1 \times 10^{19}$ cm', and/or less than $1 \times 10^{17}$ cm', $1 \times 10^{19}$ cm', or $1 \times 10^{21}$ cm$^{3}$.

Electrical conductors 44 are positioned on the slab region of the electro-absorption medium 27. Iii particular, the electrical conductors 44 each contact a portion of a doped region 40 that is in the slab region of the electro-absorption medium 27. Accordingly, each of the doped regions 40 is doped at a concentration that allows it to provide electrical communication between an electrical conductor 44 and the electro-absorption medium 27. As a result, electrical energy can be applied to the electrical conductors 44 in order to apply the electric field to the electro-absorption medium 27. The region of the light-transmitting medium or electro-absorption medium between the doped regions can be undoped or lightly doped as long as the doping is insufficient for the doped material to act as an electrical conductor that electrically shorts the modulator.

During operation of the modulators of FIG. 1A through FIG. 2E, electronics 47 (FIG. 1A) can be employed to apply electrical energy to the electrical conductors 44 so as to form an electrical field in the electro-absorption medium 27. For instance, the electronics can form a voltage differential between the doped regions that act as a source of the electrical field in the gain medium. The electrical field can be formed without generating a significant electrical current through the electro-absorption medium 27. The electro-absorption medium 27 can be a medium in which the Franz-Keldysh effect occurs in response to the application of the electrical field. The Franz-Keldysh effect is a change in optical absorption and optical phase by an electro-absorption medium 27. For instance, the Franz-Keldysh effect allows an electron in a valence band to be excited into a conduction band by absorbing a photon even though the energy of the photon is below the band gap. To utilize the Franz-Keldysh effect the active region can have a slightly larger bandgap energy than the photon energy of the light to be modulated. The application of the field lowers the absorption edge via the Franz-Keldysh effect and makes absorption possible. The hole and electron carrier wavefunctions overlap once the field is applied and thus generation of an electron-hole pair is made possible. As a result, the electro-absorption medium 27 can absorb light signals received by the electro-absorption medium 27 and increasing the electrical field increases the amount of light absorbed by the electro-absorption medium 27. Accordingly, the electronics can tune the electrical field so as to tune the amount of light absorbed by the electro-absorption medium 27. As a result, the electronics can intensity modulate the electrical field in order to modulate the light signal. Additionally, the electrical field needed to take advantage of the Franz-Keldysh effect generally does not involve generation of free carriers by the electric field.

Suitable electro-absorption media 27 for use in the modulator include semiconductors. However, the light absorption characteristics of different semiconductors are different. A suitable semiconductor for use with modulators employed in communications applications includes $Ge_{1-x}Si_x$ (germanium-silicon) where x is greater than or equal to zero. In some instances, x is less than 0.05, or 0.01. Changing the variable x can shift the range of wavelengths at which modulation is most efficient. For instance, when x is zero, the modulator is suitable for a range of 1610-1640 nm. Increasing the value of x can shift the range of wavelengths to lower values. For instance, an x of about 0.005 to 0.01 is suitable for modulating in the c-band (1530-1565 nm).

A modulator having a cross section according to FIG. 2E can be sensitive to the thickness of the slab regions of the electro-absorption medium 27. For instance, as the thickness of the slab region increases, the ridge becomes smaller and the electrical field formed between the doped regions 40 accordingly fills a smaller portion of the distance between the base 20 and the top of the ridge. For instance, the location of the electrical field effectively moves upwards from the base 20. The increased space between the electrical field and the base 20 can be thought of as increasing the resistance or carrier diffusion time of the modulator. This increase in resistance and/or diffusion time decreases the speed of the modulator. Problems also occur when these slab regions become undesirably thin. When these slab regions become thin, the doped regions extend down into the light-transmitting medium 18. This doping of the light-transmitting medium 18 also decreases the speed of the modulator.

Figure 3:
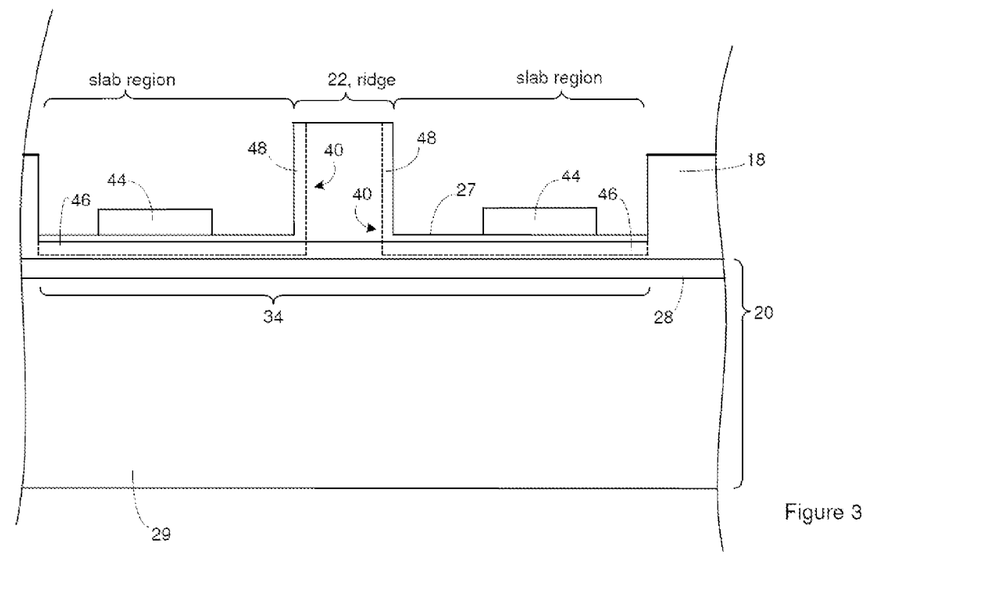
FIG. 3 is a cross section of an embodiment of a modulator having a reduced sensitivity to the thickness of the slab regions on opposing sides of a waveguide.

FIG. 3 presents an embodiment of a modulator having a reduced sensitivity to the thickness of the slab regions. The perimeter of portions of doped regions shown in FIG. 3 are illustrated with dashed lines to prevent them from being confused with interfaces between different materials. The interfaces between different materials are illustrated with solid lines. A first doped zone 46 and a second doped zone 48 combine to form each of the doped regions 40. In some instance, the first doped zone 46 is located in the light-transmitting medium 18 but not in the electro-absorption medium 27 and the second doped zone 48 is located in the electro-absorption medium 27. The first doped zone 46 can contact the second doped zone 48 or can overlap with the second doped zone 48. In some instances, the first doped zone 46 and the second doped zone 48 overlap and at least a portion of the overlap is located in the light-transmitting medium 18. In other instances, the first doped zone 46 and the second doped zone 48 overlap without any overlap being present in the electro-absorption medium 27.

The first doped zone 46 and the second doped zone 48 included in the same doped region 40 each includes the same type of dopant. For instance, the first doped zone 46 and the second doped zone 48 in an n-type doped region 40 each includes an n-type dopant. The first doped zone 46 and the second doped zone 48 included in the same doped region 40 can have the same dopant concentration or different concentrations.

Although FIG. 3 illustrates the slab regions including the electro-absorption medium 27, the slab regions of the electro-absorption medium 27 may not be present. For instance, the etch that forms the slab regions of the electro-absorption medium 27 may etch all the way through the slab regions. In these instances, the first doped zone 46 and the second doped zone 48 are both formed in the light-transmitting medium.

Although FIG. 3 shows the first doped zone 46 not extending down to the light insulator 28, the first doped zone 46 can extend down to the light insulator 28 or into the light insulator 28.

Figure 4A:
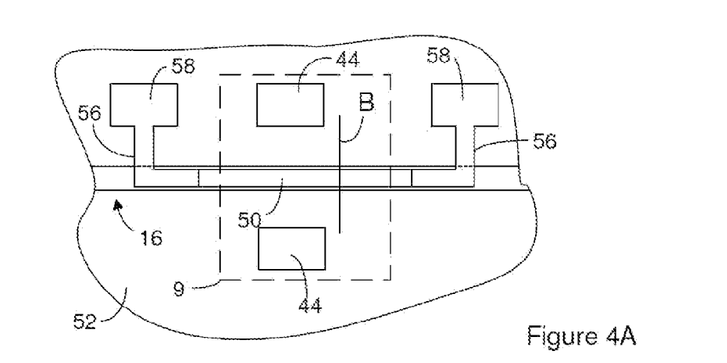
FIG. 4A is a topview of the portion of the device that includes the modulator.
Figure 4B:
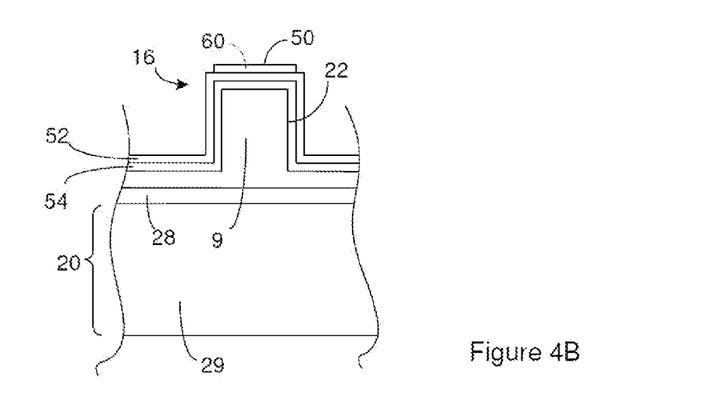
FIG. 4B is a cross section of the modulator shown in FIG. 4A taken along the line labeled B in FIG. 4A.
Figure 4C:
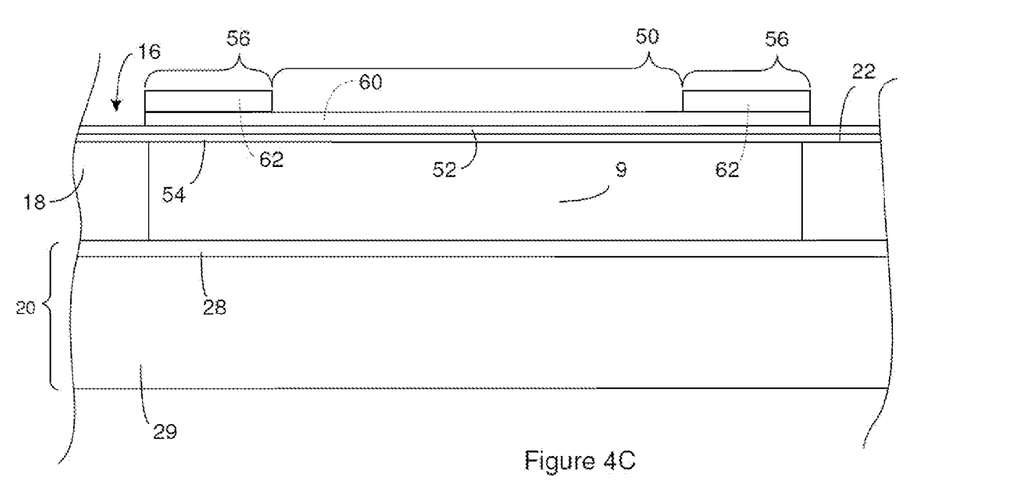
FIG. 4C is a cross section of the modulator shown in FIG. 4A taken along the longitudinal axis of the waveguide.

The above modulators can include a localized heater configured to heat all or a portion of the modulator. The localized heaters are not illustrated in FIG. 2A through FIG. 3 in order to illustrate the parts that underlay the heater. However, FIG. 4A through FIG. 4C illustrate the localized heater in conjunction with a modulator. The details of the modulator are not illustrated, but the modulator can be constructed according to FIG. 2E or FIG. 3 or can have another construction. FIG. 4A is a topview of the portion of the device that includes the modulator. FIG. 4B is a cross section of the modulator shown in FIG. 4A taken along the line labeled B in FIG. 4A. FIG. 4C is a cross section of the modulator shown in FIG. 4A taken along the longitudinal axis of the waveguide 16.

The heater 50 is on the ridge 22 such that the modulator is positioned between the heater 50 and the base. One or more layers of material can optionally be positioned between the heater and the ridge. For instance, the heater 50 can be located on an insulating layer 52 that electrically insulates the heater from the underlying layers. The insulating layer 52 is positioned between the heater and the ridge 22. Suitable insulating layers 52 include, but are not limited to, silica and silicon nitride. An insulating layer with a higher thermal conductivity may be preferred in or to provide a pathway from heat to travel from the heater to the modulator. Accordingly, insulating layers 52 that are thinner and/or have a higher thermal conductivity may be desired. In some instances, the insulating layer 52 has a thermal conductivity above 10 W/mK.

One or more claddings 54 are optionally positioned between the waveguide 16 and the insulating layer 52 and/or between the waveguide 16 and the heater 50. At least one of the claddings 54 can directly contact the light-transmitting medium 18. A cladding that contacts light-transmitting medium 18 preferably has a lower index of refraction than the light-transmitting medium 18. When the light-transmitting medium 18 is silicon, suitable claddings include, but are not limited to, polymers, silica, SiN and $LiNbO_3$. In some instances, a single layer of material can serve as both a cladding 54 and an insulating layer 52. Although the insulating layer 52 is shown as a single layer of material, the insulating layer 52 can include or consist of multiple layers of material.

Conductors 56 are positioned so as to provide electrical communication between the heater 50 and contact pads 58. The conductors 56 and contact pads 58 can be electrically conducting. The electronics 47 can apply electrical energy to the contact pads 58 so as to deliver electrical energy to the heater 50 and can accordingly operate the heater so the heater 50 generates heat. The location of the heater on the ridge 22 allows the generated heat to elevate the temperature of the ridge through a mechanism such as conduction.

In some instances, the heater 50 is an "electrical resistance heater." For instance, the heater 50 can include or consist of an electrically conducting layer 60 that serves as a resistor. An example of a suitable resistor is a trace that includes or consists of a metal, metal alloy. Examples heaters include or consist of titanium traces, tungsten titanium traces, and nichrome traces. During operation of the device, the electronics 47 can drive sufficient electrical current through the electrically conducting layer 60 to cause the electrically conducting layer 60 to generate the heat that is conducted to the modulator. The conductors 56 can include or consist of an electrically conductive layer 62 and can be arranged such that the electrical current flows parallel or substantially parallel to the ridge 22 or the direction of light signal propagation through the ridge. As a result, the length of the ridge 22 that is heated by the heater can be increased merely by increasing the length of the resistor.

The electrically conducting layer 60 can have a higher resistance/length than the electrically conductive layers 62 in order to stop or reduce generation of heat by the conductors 56. This can be achieved by using different materials and/or dimensions for the electrically conductive layer 62 and the conducting layer 60. For instance, the electrically conductive layer 62 can be aluminum while the conducting layer 60 that serves as the heater is titanium. Titanium has a specific electrical resistance of about 55 μohm-cm while aluminum has a specific electrical resistance of about 2.7 μohm-cm. As a result, the conductors 56 and conducting layer 60 can have similar cross sectional dimensions and an electrical current can be driven through the conductors 56 and conducting layer such that heat is generated at the conducting layer without undesirable levels of heat being generated by the conductors 56. Alternately, the conductors 56 can have larger cross section dimensions than the heater in order to further reduce heat generation by the conductors 56.

In some instances, the conductors 56 include a conducting layer 60 from the heater 50 in addition the conductive layer 62 as is evident in FIG. 4B. In these instances, the conductive layer 62 can be more conductive and/or have larger dimensions than the conducting layer 60 in order to reduce generation of heat by the conductor 56. When the conductors 56 includes the conducting layer 60 and the conductive layer 62, the conductors 56 and heater can be formed by forming a first layer of the material for the conducting layer and then forming a second layer of material for the conductive layer over the first layer. Suitable methods for forming the first layer and the second layer on the device include, but are not limited to, sputtering. The first layer and the second layer can then be patterned so as to form the conductors and heater on the device. Suitable methods for patterning include, but are not limited to, etching in the presence of one or more masks. The portion of the second layer over the heater 50 can then be removed to provide the configuration of conducting layer and conductive layer shown in FIG. 4A and FIG. 4B. Suitable methods for removing the portion of the second layer include, but are not limited to, etching in the presence of a mask. Although the electrically conducting layer 60 and the electrically conductive layers 62 are disclosed as a single layer of material, either or both of the electrically conducting layer 60 and the electrically conductive layers 62 can include or consist of one or more different layers of material.

A suitable ratio for the specific electrical resistance of the conducting layer 60:conductive layer 62 is greater than 5:1, 10:1, or 50:1.

Figure 5A:
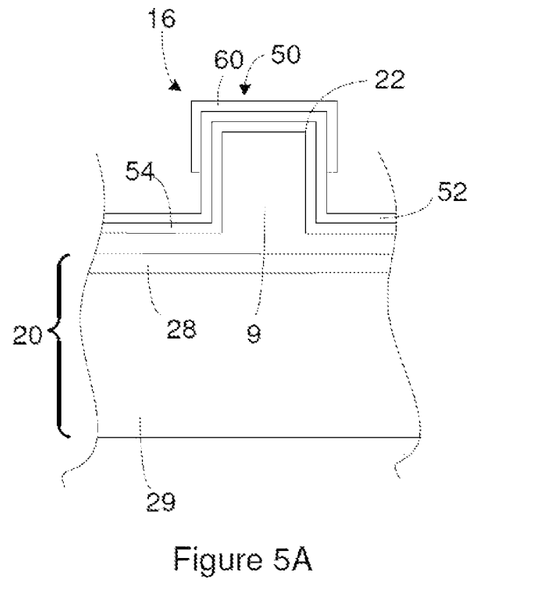
FIG. 5A is a cross section of a portion of a device that includes a heater on a modulator. The heater is positioned over the top and lateral sides of the modulator.

FIG. 4A through FIG. 4C illustrate the heater 50 as being positioned on the top of the electro-absorption medium or on top of the ridge 22. Additionally or alternately, the heater can be positioned on one or more lateral sides of the electro-absorption medium or on one or more lateral sides of the ridge 22. For instance, FIG. 5A is a cross section of the device such as the cross section of FIG. 4B. FIG. 5A illustrates the heater positioned on both the top and lateral sides of the ridge 22. As a result, the heater is positioned on both the top and lateral sides of the electro-absorption medium 27. In some instances, the heater 50 is positioned on one or more of the lateral sides of the electro-absorption medium 27 without being positioned on the top of the electro-absorption medium 27 and/or on one or more of the lateral sides of the ridge 22 without being positioned on the top of the ridge 22. The heater does not extend down to the base of the ridge but can extend all the way to the base of the ridge.

Figure 5B:
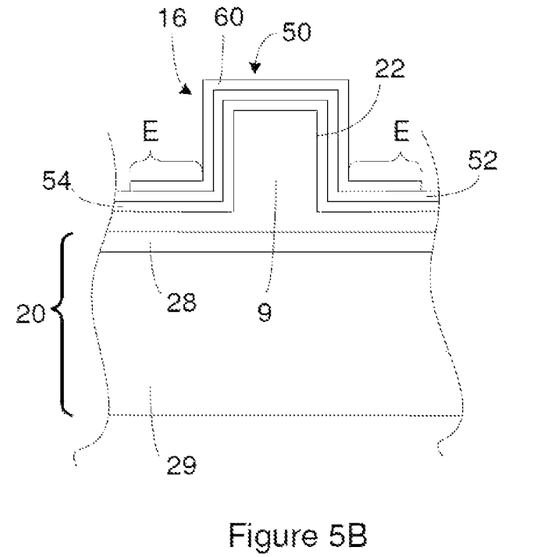
FIG. 5B is a cross section of a portion of a device that includes a heater on a modulator.

The heater 50 can extend away from the ridge 22 such that the heater 50 is positioned over the slab regions. For instance, FIG. 5B is a cross section of the modulator where the heater is positioned on the ridge of the electro-absorption medium 27, extends down to the base of the ridge 22, and extends away from the base of the ridge 22 on the slab regions. The distance that the heater extends away from the ridge is labeled E in FIG. 5B. The distance is equal to the distance between the edge of the heater and the portion of the heater on the lateral side of the ridge 22. Increasing the distance that the heater extends away from the ridge can reduce the degree of localized heating and can increase the power requirements for the device. In some instances, the distance that the heater extends away from the ridge is less than 2 μm, 1 μm, or 0.5 μm and can be 0 μm. The bottom or lower side of the heater 50 is between the top (or upper side) of the heater 50 and the modulator 9 and/or the electro-absorption medium 27. In some instances, the heater 50 is arranged such that the bottom (or lower side) of the heater 50 does not contact the device at a location that is more than 2 μm, 200 μm, or 500 μm away from a lateral side of the ridge and/or an edge of the heater is not located more than 2 μm, 200 μm, or 500 μm away from the nearest lateral side of the ridge. In other words, no portion of the heater through which heat travels to the device is located more than 2 μm, 200 μm, or 500 μm away from the nearest lateral side of the ridge or the heater is not positioned over a location that is more than 2 μm, 200 μm, or 500 μm away from the nearest lateral side of the ridge.

In FIG. 4A through FIG. 5B, the bottom (lower side) of the heater 50 is between the top of the heater 50 and the modulator 9 and/or the electro-absorption medium 27. Moving the bottom of the heater 50 closer to the electro-absorption medium 27 and/or the ridge 22 reduces the distance over which the generated heat must be conducted in order to elevate the temperature of the modulator and can accordingly reduce the amount of heat that must be generated in order to achieve a particular temperature within the modulator. Reducing the thickness of the one or more layers of material between the bottom of the heater and the electro-absorption medium 27 can move the bottom of the heater 50 closer to the electro-absorption medium 27. For instance, reducing the thickness of the one or more claddings 54 and the one or more insulating layers 52 can move the bottom of the heater 50 closer to the electro-absorption medium 27. In some instances, all or a portion of the bottom of the heater 50 is within 0.5, 1, or 2 μm of the electro-absorption medium 27.

Figure 6A:
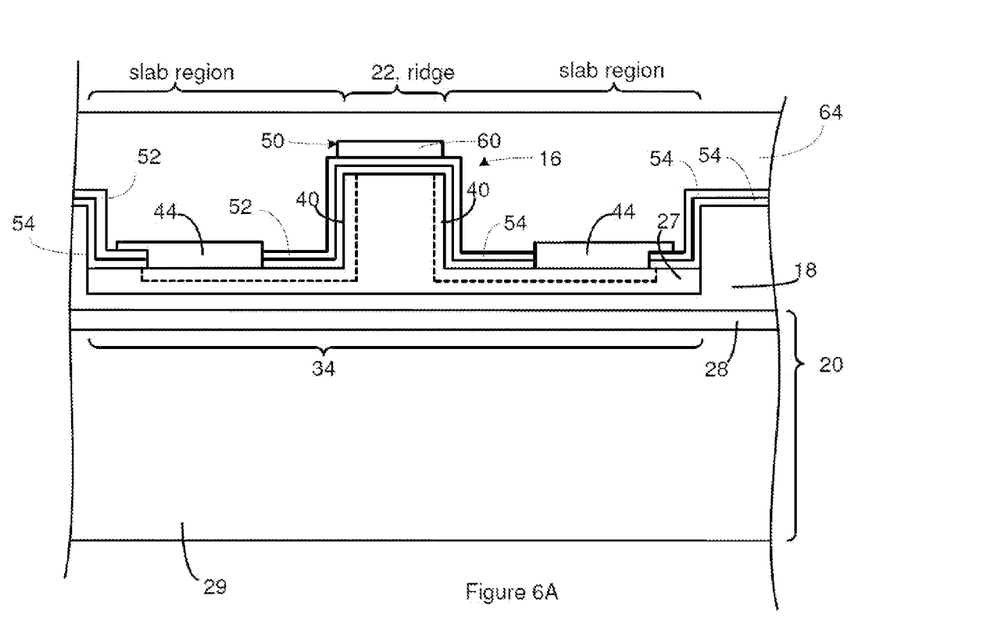
FIG. 6A is a cross section of the device taken through the modulator.
Figure 6B:
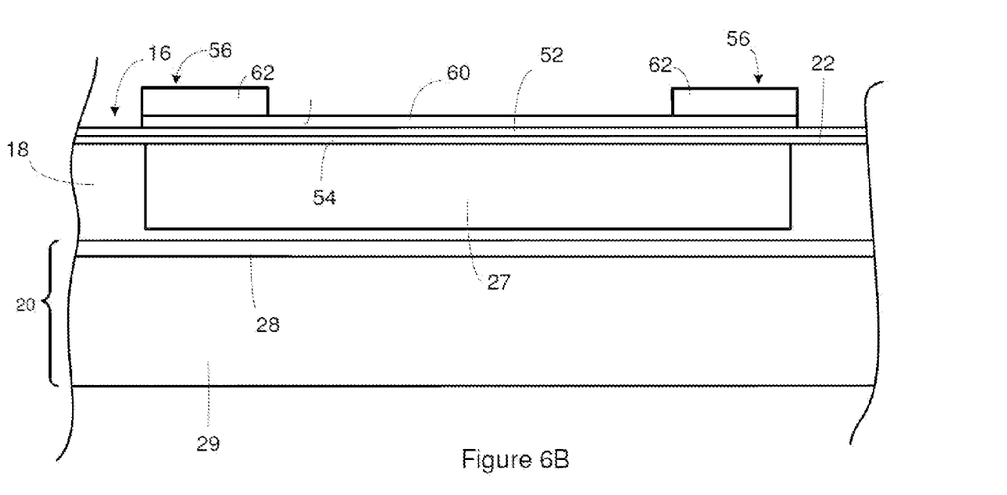
FIG. 6B is a cross section of the device taken along the length of the waveguide.

The details of the modulator construction are not illustrated in FIG. 4A through FIG. 5B; however, the modulator can have a variety of constructions including, but not limited to, the constructions of FIG. 2E or FIG. 3. In order to illustrate this concept, FIG. 6A and FIG. 6B illustrate the device of FIG. 4A through FIG. 4C in combination with the modulator of FIG. 2E. FIG. 6A is a cross section of the device taken through the modulator. FIG. 6B is a cross section of the device taken along the length of the waveguide. The heater 50 is positioned over at least a portion of the electro-absorption medium 27 that is included in the modulator such that the electro-absorption medium 27 is located between the heater 50 and the base. FIG. 6B shows that the heater 50 does not extend beyond the perimeter of the electro-absorption medium 27; however, one or both ends of the electro-absorption medium 27 can extend beyond the perimeter of the electro-absorption medium 27.

As is evident in FIG. 6A, a protective layer 64 can optionally be formed over the above devices. In some instances, the protective layer 64 can have a thermal conductivity that is less than the thermal conductivity of the one or more claddings 54 and/or the one or more insulating layers 52. The reduced thermal conductivity of the protective layer 64 causes heat generated by the heater to be directed toward the modulator and can accordingly reduce the energy requirements of the heater as well as reduce thermal cross talk. Suitable protective layers include, but are no limited to, silica, silicon nitride, and aluminum oxide. Although the protective layer is disclosed as a single layer of material, the protective layer can be constructed of multiple layers of material. In some instances, one, two or three layers of the protective layer have a thermal conductivity greater than 0.75 WK/m, 1.0 WK/m, or 1.25 WK/m. The protective layer is not illustrated in FIG. 6B.

The modulator of FIG. 4A through FIG. 5B can have constructions other than the constructions of FIG. 1A through FIG. 3. Examples of other suitable modulator constructions can be found in U.S. patent application Ser. No. 12/653,547, filed on Dec. 15, 2009, entitled "Optical Device Having Modulator Employing Horizontal Electrical Field," and U.S. patent application Ser. No. 13/385,774, filed on Mar. 4, 2012, entitled "Integration of Components on Optical Device," each of which is incorporated herein in its entirety. U.S. patent application Ser. Nos. 12/653,547 and 13/385,774 also provide additional details about the fabrication, structure and operation of these modulators. In some instances, the modulator is constructed and operated as shown in U.S. patent application Ser. No. 11/146,898; filed on Jun. 7, 2005; entitled "High Speed Optical Phase Modulator," and now U.S. Pat. No. 7,394,948; or as disclosed in U.S. patent application Ser. No. 11/147,403; filed on Jun. 7, 2005; entitled "High Speed Optical Intensity Modulator," and now U.S. Pat. No. 7,394,949; or as disclosed in U.S. patent application Ser. No. 12/154,435; filed on May 21, 2008; entitled "High Speed Optical Phase Modulator," and now U.S. Pat. No. 7,652,630; or as disclosed in U.S. patent application Ser. No. 12/319,718; filed on Jan. 8, 2009; and entitled "High Speed Optical Modulator;" or as disclosed in U.S. patent application Ser. No. 12/928,076; filed on Dec. 1, 2010; and entitled "Ring Resonator with Wavelength Selectivity;" or as disclosed in U.S. patent application Ser. No. 12/228,671, filed on Aug. 13, 2008, and entitled "Electrooptic Silicon Modulator with Enhanced Bandwidth;" or as disclosed in U.S. patent application Ser. No. 12/660,149, filed on Feb. 19, 2010, and entitled "Reducing Optical Loss in Optical Modulator Using Depletion Region;" each of which is incorporated herein in its entirety. A review of the modulators disclosed in these applications shows that the slab regions of the electro-absorption medium 27 are optional. The heater 50, one or more insulating layers 52, one or more claddings 54, and conductors 56 can be fabricated using fabrication technologies that are employed in the fabrication of integrated circuits, optoelectronic circuits, and/or optical devices.

The device can also include one or more temperature sensors (not shown) that are each positioned to sense the temperature of the modulator and/or the temperature of a zone adjacent to the modulator. Suitable temperature sensors include, but are not limited to, thermocouples, thermistors, integrated PN diodes, or other integrated semiconductor devices.

The electronics can adjust the level of electrical energy applied to the heater in response to the output received from the one or more temperature sensors in a feedback loop. For instance, the electronics can operate the heater such that the temperature of the heater stays at or above a threshold temperature ($T_{th}$) during operation of the device. For instance, when the electronics determine that the temperature of the modulator falls below the threshold temperature, the electronics can apply electrical energy to the heater so as to bring the temperature of the modulator to or above the threshold temperature. However, when the electronics determine that the temperature of the modulator falls above the threshold temperature, the electronics can refrain from applying the electrical energy to the heater. As a result, when the electronics determine that the temperature of the modulator is above the threshold temperature, the temperature of the modulator can float in response to the operation of the device in the ambient atmosphere.

The device is configured to operate over an operational ambient temperature range. For instance, the device should be able to continue operating when the ambient temperature in which the device is positioned (TA) extends from TL to TH. In some instances, TL is below 0° C., 10° C., or 20° C. and/or TH is greater than 50° C., 70° C., or 80° C. The operational ambient temperature range is typically from TL=0° C. to TH=70° C. The operational temperature range is generally defined as part of the specification for the device. In general the operational temperature range is designed so the device meets customer requirements.

The width of the band of wavelengths that can be efficiently modulated by a modulator is the operating bandwidth (OBW) of the modulator. The operating bandwidth is generally the length of the band of wavelengths where the modulator has low insertion loss and high extinction ratio at a particular temperature. For a Franz Keldysh modulator constructed according to FIG. 2E, the operating bandwidth (OBW) is generally about 35 nm. The operating bandwidth (OBW) for a modulator can be identified by applying a modulation signal to the modulator and measuring the response of the optical signal through the modulator over a range of wavelengths. The range of wavelengths for which the insertion loss and high extinction ratio produce loss of less than 1 dB can serve as the operating bandwidth. In some instances, the range of wavelengths for which the insertion loss and high extinction ratio produce loss of less than 1.5 dB or 2.0 can serve as the operating bandwidth. In some instances, the operating wavelength range for a modulator is more than 25 nm, 30 nm, or 35 nm and/or less than 40 nm, 50 nm, or 60 nm.

The wavelength at the center of the operating bandwidth (OBW) is considered the modulation wavelength. The wavelengths that fall within the operating bandwidth (OBW) shifts in response to temperature changes; however, the operating bandwidth (OBW) stays constant or substantially constant. As a result, the modulation wavelength is a function of temperature but the operating bandwidth (OBW) can be approximated as being independent of temperature. The rate that the modulation wavelength of the above modulators shifts in response to temperature changes ($\Delta\lambda_m$) is about 0.76 nm/° C. and the operating bandwidth (OBW) stays substantially constant at about 35 nm.

The most intense wavelength produced by the light source is considered the channel wavelength of the light signal produced by the light source. The light source and the modulator are generally configured to operate together at a design temperature (TT). For instance, the light source and modulator are generally configured such that the modulation wavelength and the channel wavelength are the same at the design temperature. As a result, the modulator efficiently modulates the output of the light source at the design temperature. The design temperature is generally equal to a common temperature for the ambient environment in which the device is positioned. A typical design temperature is 60° C. In some instances, the design temperature serves as the threshold temperature ($T_{th}$).

The channel wavelength and the modulation wavelength at the design temperature are the design wavelength ($\lambda_T$). The modulation wavelength at a particular temperature can be expressed relative to the design wavelength. For instance, the modulation wavelength at a particular temperature can be expressed as $\lambda_T-(TT-T_m)(\Delta\lambda_m)$ where $T_m$ represents the temperature of the modulator.

The channel wavelength shifts in response to changes in the temperature of the light source ($T_{LS}$). For instance, the channel wavelength shift rate for a light source ($\Delta\lambda_{LS}$) such as a DFB laser is generally about 0.08 nm/° C. at 1550 nm and for a Fabry-Perot laser is generally about 0.5 nm/° C. The wavelength of the light source at a particular temperature can be expressed as follows: $\lambda_T-(TT-T_{LS})(\Delta\lambda_{LS})$. Other suitable light sources have a rate of modulation wavelength shift greater than 0.05, 0.1, or 0.2 nm/° C. and/or less than 0.3, 0.5, or 0.7 nm ° C.

Variables in the fabrication process generally produce modulators having a range of modulation wavelengths at a particular temperature. For instance, a batch of modulators will generally have modulation wavelengths that are equal to the desired modulation wavelengths+/−a manufacturing tolerance. The manufacturing tolerance can be indicated by a multiple of the standard deviation. For instance, a Franz Keldysh modulator constructed according to FIG. 2E generally has a manufacturing tolerance (MT) of about 7.5 nm where 7.5 nm represents three times the standard deviation. The presence of this manufacturing tolerance reduces the amount that the wavelength of a light signal being received by the modulator can shift while still reliably falling within the operating bandwidth (OBW) for each of the modulators. For instance, a light signal that shifts by less than a permissible range (PR) will still reliably have a wavelength that falls within the operating bandwidth (OBW) of a modulator fabricated with the above manufacturing tolerance and can accordingly be efficiently modulated by the modulator. The permissible range (PR) can be determined as ((OBW−2MT)/2).

The difference between the modulation wavelength and the channel wavelength must be less than or equal to the permissible range (PR) of the modulator in order for the modulator to reliably provide efficient modulation of the light signal. Accordingly, under these conditions, it can be stated that $[\lambda_T-(TT-T_m)(\Delta\lambda_m)]-[\lambda_T-(TT-T_{LS})(\Delta\lambda_{LS})]\leq PR$ or $(TT-T_{LS})(\Delta\lambda_{LS})-(TT-T_m)(\Delta\lambda_m)\leq PR$. Solving for $T_{LS}$ provides that $T_{LS}\geq TT-[PR-(TT-T_m)(\Delta\lambda_m)]/(\Delta\lambda_{LS})$. When the electronics hold the temperature of the modulator constant at $T_{th}$, this expression becomes $T_{LS}\geq TT-[PR-(TT-T_{th})(\Delta\lambda_m)]/(\Delta\lambda_{LS})$. In instances where the threshold temperature is equal to the design temperature (TT), this expression reduces to $T_{LS}\geq TT-[PR/(\Delta\lambda_{LS})]$ or $T_{LS}\geq TT-[(OBW/2-MT)/(\Delta\lambda_{LS})]$. Using the above numbers for a DFB laser where the threshold temperature is equal to a design temperature of 60° C. shows that the light source temperature ($T_{LS}$) can fall as low as [60° C.−[(35 nm/2−7.5 nm)]/(0.08 nm/° C.)]=−65° C. before the channel wavelength falls outside of the permissible range (PR) of the modulator. Accordingly, efficient modulation of the light signal produced by the light source can still be achieved when the light source temperature ($T_{LS}$) drops to −65° C. However, TL is generally about 0° C. As a result, the threshold temperature can actually be reduced below the design temperature. For instance, a threshold temperature of 54° C. permits the light source temperature ($T_{LS}$) to fall as low as −8° C. before the channel wavelength falls outside of the permissible range (PR) of the modulator. The ability of the threshold temperature to be below the design temperature reduces the power requirements associated with the heater.

As noted above, the electronics can refrain from operating the heater when the temperature of the modulator would be above the threshold temperature without the operation of the heater. Substituting the above numbers into $(TT-T_{LS})(\Delta\lambda_{LS})-(TT-T_m)(\Delta\lambda_m)\leq PR$ shows that the temperature of the light source and the modulator can concurrently be as high as about 74° C. while still having a wavelengths that fall within the permissible range (PR). However, the upper end of the operational ambient temperature range (TH) is generally about 70° C. As a result, the operation of the modulator and light sensor can drive the temperature of both of these components up by an additional 4° C. while still achieving efficient modulation of the light signal. Accordingly, the method of operating the heater provides efficient light signal modulation across the entire operational ambient temperature range (TH).

Simulation results have shown that for a heater that is 20 μm long used with a modulator having a ridge with of 1 μm, a ridge height of 2.7 μm, and a slab region thickness of 0.3 μm, the power requirements for a heater constructed as disclosed above are about 1-2 mW/° C. Accordingly, when the temperature of a modulator would be at 0° C. without operation of the heater, a power in a range of 60 to 120 mW would be needed to keep the temperature of the modulator at a threshold temperature of 60° C. and a power of only about 54 to 108 mW would be needed to keep the temperature of the modulator at a threshold temperature of 54° C. Since 0° C. is generally the bottom of the operational ambient temperature range, the maximum power requirement for the heater is less than 120 mW, 108 mW, 80 mW, 60 mW or 54 mW.

Although the device is disclosed as having a single modulator and heater, this is for illustrative purposes and a single device will often have more than one modulator that includes a heater constructed and/or operated as disclosed above. Examples of a single device that includes multiple light sources and multiple modulators can be found in U.S.

patent application Ser. No. 14/048,685, filed on Oct. 8, 2013, and entitled "Use of Common Active Materials in Optical Components" and in other patent applications that are incorporated into this disclosure. Different heaters on a single device can be operated using the same method variables or using different method variables. For instance, different heaters can be operated with different threshold temperatures or can be operated with the same threshold temperature. Accordingly, the different modulators can be at different temperatures.

Although FIG. 1A and FIG. 1B illustrate a waveguide that connects the light source directly with a modulator, the device need not include a light source as is disclosed above. Further, the device can be constructed such that the modulator receives a light signal that includes at least a portion of the light generated from one or more light sources. Accordingly, other components can be optically between the light source and the modulator. For instance, the device can include a multiplexer that multiplexes light signals from multiple light sources into a second light signal that is received by the modulator constructed as disclosed above. Additionally or alternately, the device can include a demultiplexer that receives a light signal from multiple different light sources and demultiplexes the light signal into multiple second light sources such that at least one of the second light signals is received by the modulator constructed as disclosed above. Accordingly, multiplexers and demultiplexers can be positioned between a light source and a modulator that receives at least a portion of the light output from the light sensor. Other examples of components that can be optically between a light source and a modulator that receives at least a portion of the light output by the light source include, but are not limited to, amplifiers, switches, combiners, splitters, y-junctions, optical taps, in-line photodetectors and polarization rotators.

Although the above heater is disclosed as generating heat through the application of electrical energy to the heater, other heating mechanisms can be employed. For instance, the heater can guide a heated liquid or can be a source of a light.

Although the device is disclosed in the context of a silicon-on-insulator platform, the device can be constructed on other platforms.

Although the above modulators are disclosed as having a single heater, a modulator can include more than one heater or more than one heating element. For instance, a heater can include multiple resistors connected in series or in parallel.

Although the heater is disclosed as being positioned on the ridge of a modulator, the heater can be positioned on the ridge of other optical components such as light sensors and light sources such as are disclosed in U.S. patent application Ser. No. 13/506,629.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. An optical device, comprising:
  a waveguide positioned on a base and a modulator positioned on the base,
    the modulator including an electro-absorption medium,
      a ridge of the electro-absorption medium extending away from the base, the ridge including lateral sides that connect a top side to a bottom side such that the bottom side is between the top side and the base,
    the waveguide configured to guide a light signal through the modulator such that the light signal is guided through the electro-absorption medium;
    a heater positioned on the electro-absorption medium, the heater being positioned on one or more of the lateral sides of the ridge.

2. The device of claim 1, wherein the modulator is a Franz-Keldysh modulator that uses the Franz-Keldysh effect to modulate light signals.

3. The device of claim 1, wherein the heater is positioned over the top side of the ridge such that the electro-absorption medium is between the base and the heater.

4. The device of claim 1, wherein the ridge is positioned between slab regions of the electro-absorption medium such that the slab regions of the electro-absorption medium are continuous with the ridge of the electro-absorption medium.

5. The device of claim 1, wherein at least a portion of the heater is less than 2 µm from the ridge.

6. The device of claim 1, wherein no portion of the heater is more than 2 µm from the ridge.

7. The device of claim 1, wherein a ridge of a light-transmitting medium is positioned on the base and a ridge of the electro-absorption medium is positioned on the base,
  the waveguide being configured to guide the light signal through both the ridge of the light-transmitting medium and the ridge of the electro-absorption medium.

8. An optical device, comprising:
  a waveguide positioned on a base and a modulator positioned on the base,
    the modulator including an electro-absorption medium,
    the waveguide configured to guide a light signal through the modulator such that the light signal is guided through the electro-absorption medium;
    a heater positioned on the electro-absorption medium such that the electro-absorption medium is between the base and the heater
    a light source positioned on the base such that the light signal includes at least a portion of the light generated by the light source,
      the light source generating a light signal having the most intense wavelength at a design wavelength when the light source is at a design temperature, the modulator being configured to modulate light signal at a modulation wavelength, the modulation wavelength being equal to the design wavelength when the modulator is at the design temperature; and
    electronics configured to operate the heater such that a temperature of the heater is maintained above a threshold temperature, the threshold temperature being less than or equal to the design temperature.

9. The device of claim 8, wherein the electronics are configured to operate the heater such that the heater does not generate heat in response to a temperature of the modulator being above the threshold temperature.

10. The device of claim 9, wherein the threshold temperature is less than the design temperature.

11. The device of claim 8, wherein the electronics permit the temperature of the modulator to float when the electronics determine that the temperature of the modulator is above the threshold temperature.

12. An optical device, comprising:
  a waveguide positioned on a base and a modulator positioned on the base,
    the modulator including an electro-absorption medium;

the waveguide configured to guide a light signal through the modulator such that the light signal is guided through the electro-absorption medium;

a heater positioned on the electro-absorption medium;

a light source positioned on the base such that the light signal includes at least a portion of the light generated by the light source, the light source having a channel wavelength shift rate greater than 0.05 nm/° C.

13. The device of claim 12, wherein the modulator is a Franz-Keldysh modulator that uses the Franz-Keldysh effect to modulate light signals.

14. The device of claim 12, wherein a ridge of the electro-absorption medium extends away from the base, the ridge including lateral sides that connect a top side to a bottom side such that the bottom side is between the top side and the base, and the heater is positioned over the top side of the ridge such that the electro-absorption medium is between the base and the heater.

15. The device of claim 12, wherein a ridge of the electro-absorption medium extends away from the base and is positioned between slab regions of the electro-absorption medium such that the slab regions of the electro-absorption medium are continuous with the ridge of the electro-absorption medium.

16. The device of claim 12, wherein a ridge of the electro-absorption medium extends away from the base, the ridge including lateral sides that connect a top side to a bottom side such that the bottom side is between the top side and the base, and at least a portion of the heater is less than 2 μm from the ridge.

17. The device of claim 12, wherein a ridge of the electro-absorption medium extends away from the base and no portion of the heater is more than 2 μm from the ridge.

18. The device of claim 12, wherein the light source generates a light signal having the most intense wavelength at a design wavelength when the light source is at a design temperature, the modulator is configured to modulate light signal at a modulation wavelength, the modulation wavelength being equal to the design wavelength when the modulator is at the design temperature; and electronics configured to operate the heater such that a temperature of the heater is maintained above a threshold temperature, the threshold temperature being less than or equal to the design temperature, the electronics permitting the temperature of the modulator to float when the electronics determine that the temperature of the modulator is above the threshold temperature.

19. The device of claim 18, wherein the electronics are configured to operate the heater such that the heater does not generate heat in response to a temperature of the modulator being above the threshold temperature.

20. The device of claim 18, wherein the threshold temperature is less than the design temperature.

21. An optical device, comprising:

a waveguide positioned on a base and a modulator positioned on the base, the modulator including an electro-absorption medium, the waveguide configured to guide a light signal through the modulator such that the light signal is guided through the electro-absorption medium;

a heater positioned on the electro-absorption medium such that the electro-absorption medium is between the base and the heater;

a light source configured to generate light such that the light signal includes at least a portion of the light generated by the light source;

the light source outputting the light at a channel wavelength and the modulator configured to modulate the light signal at a modulation wavelength, the modulation wavelength and the channel wavelength being the same when the modulator and the light source are both at a design temperature; and electronics configured to operate the heater such that a temperature of the heater is maintained above a threshold temperature, the threshold temperature being less than or equal to the design temperature.

22. The device of claim 21, wherein the electronics are configured to operate the heater such that the heater does not generate heat in response to a temperature of the modulator being above the threshold temperature.

23. The device of claim 21, wherein the threshold temperature is less than the design temperature.

24. The device of claim 21, wherein the modulator efficiently modulates light having wavelength in an operating bandwidth (OBW) and the modulation wavelength is the wavelength at a center of the operating bandwidth.

* * * * *